United States Patent
Seo

(10) Patent No.: US 7,300,879 B2
(45) Date of Patent: Nov. 27, 2007

(54) METHODS OF FABRICATING METAL WIRING IN SEMICONDUCTOR DEVICES

(75) Inventor: Byoung-Yoon Seo, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/264,550

(22) Filed: Nov. 1, 2005

(65) Prior Publication Data

US 2006/0094245 A1 May 4, 2006

(30) Foreign Application Priority Data

Nov. 3, 2004 (KR) .................. 10-2004-0088692

(51) Int. Cl.
 *H01L 21/311* (2006.01)
(52) U.S. Cl. ............... 438/700; 438/637; 438/640; 257/E21.585; 257/E23.011
(58) Field of Classification Search ........... 438/700, 438/701, 713, 745; 257/E21.585, E23.011, 257/E29.119
See application file for complete search history.

(56) References Cited

U.S. PATENT DOCUMENTS

| 6,444,588 | B1 * | 9/2002 | Holscher et al. | ............ 438/737 |
| 6,503,829 | B2 * | 1/2003 | Kim et al. | .................. 438/637 |
| 2002/0027254 | A1 * | 3/2002 | Kwean | ........................ 257/382 |
| 2005/0073053 | A1 * | 4/2005 | Park | ........................... 257/774 |

* cited by examiner

*Primary Examiner*—Long K. Tran
(74) *Attorney, Agent, or Firm*—Andrew D. Fortney

(57) ABSTRACT

Manufacturing costs may be reduced and yield may be improved when metal wiring in a semiconductor device is fabricated by a disclosed method including: sequentially forming an etch stop layer, an intermetal insulation layer, an anti-reflection coating layer, and a mask pattern on a semiconductor substrate formed with a lower structure; etching the anti-reflection coating layer using the mask pattern; forming a trench by removing the intermetal insulation layer to a predetermined depth by performing wet etching using the mask pattern; forming a via hole by removing the remaining intermetal insulation layer and the etch stop layer by dry etching them using the mask pattern; and removing the mask pattern.

18 Claims, 3 Drawing Sheets

METHODS OF FABRICATING METAL WIRING IN SEMICONDUCTOR DEVICES

FIELD OF THE DISCLOSURE

The present disclosure relates to methods of manufacturing semiconductor devices using a dual damascene process. More particularly, the present disclosure relates to methods of fabricating metal wiring while reducing manufacturing costs and improving yield due to reduction of the number of processes involved.

BACKGROUND

Recently, as semiconductor integrated circuits have become more highly integrated and their operation speed has increased, metal lines in semiconductor devices have become narrower and multi-layered. In addition, copper wiring and low dielectric constant (low-k) materials have been proposed for minimizing the RC signal delay associated with such lines. Furthermore, patterning of wiring has become more difficult as the design rule has decreased, and, thus, a damascene process has been developed to skip a metal etching step and an insulator gap-filling step in a metallization process. Such a damascene processes may be categorized as single damascene and dual damascene processes. A conventional method of metallization by a dual damascene process will hereinafter be described as an example of a general damascene process.

An etch stop layer, an intermetal insulating layer, and an anti-reflection layer are sequentially formed on a lower metal layer. Then, a via mask is formed on the anti-reflection layer. A via hole is formed by selectively etching the anti-reflection layer and the intermetal insulating layer by the via mask and then ashing the mask.

After filling the via hole with a sacrificial layer (for example, formed of novolac), the sacrificial layer is recessed to a predetermined depth. Then, after coating an anti-reflection layer, a trench mask is formed. A trench is then formed by a dry etching process using the trench mask.

Subsequently, the trench mask and the sacrificial layer remaining in the via hole are removed by an ashing process. In addition, the etch stop layer exposed in the bottom of the via hole is removed to complete a dual damascene pattern including a via hole and a trench. A metallization process is then completed by subsequently forming a barrier metal layer in the damascene pattern, filling the damascene pattern with a conductive material such as copper, and polishing the conductive material.

In such a conventional method of fabricating metal wiring, mask patterns for a via hole and a trench are separately required, since the via hole is formed first and then the trench is formed. Therefore, a process for fabricating metal wiring is complicated since the dry etching process using the mask and the ashing process for removing the mask pattern are respectively performed twice, and a sacrificial layer is involved.

In addition, in the conventional method of fabricating metal wiring described above, when the sacrificial layer is not completely removed during the ashing process for removing the trench mask, the etch stop layer is also not completely removed. Accordingly, the contact resistance increases, thereby causing a degradation of device characteristics.

Figure 1A:
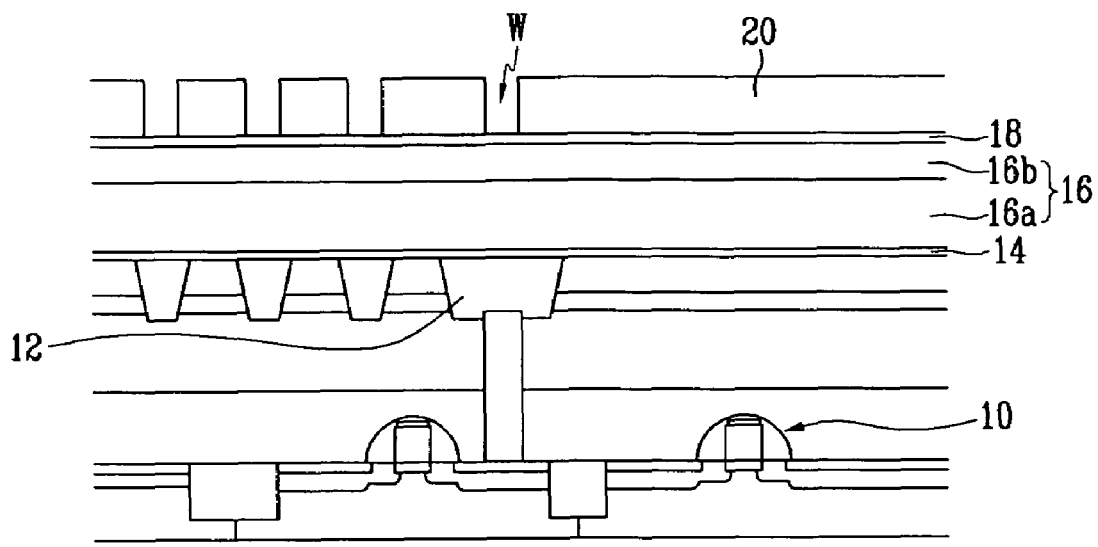
FIG. 1A to FIG. 1E are cross-sectional views showing sequential stages of an example method of fabricating metal wiring performed in accordance with the teachings of the present invention.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

FIG. 1A to FIG. 1E are cross-sectional views showing sequential stages of an example method of fabricating metal wiring performed in accordance with the teachings of the present invention.

FIG. 1A illustrates an etch stop layer 14, an intermetal insulation layer 16, an anti-reflection coating layer 18, and a mask pattern 20 formed on a semiconductor substrate having a lower structure of, for example, a MOS transistor 10 and a lower metal line 12.

When the intermetal insulation layer 16 is an oxide (or is oxide-based), and/or when the intermetal insulation layer 16 is an organic material having a low dielectric constant (hereinafter called a low-k organic material), the etch stop layer 14 may be formed of, for example, a silicon nitride.

In addition, the intermetal insulation layer 16 may include first and second insulator layers 16a and 16b.

The first insulator layer 16a may be formed of any insulator generally used in a wiring structure. For example, the insulator may be formed of silicon dioxide ($SiO_2$), a low dielectric constant (low-k) material, a material known as polyarylether, or Flowfill. A fluorinated polyimide, fluorinated silicate glass, amorphous-fluorinated carbon, etc., may be used as the low-k material. Alternatively, the low-k material may be derived from parylene-$AF_4$ or silicon oxide, an example of which is a black diamond.

In addition, as with the first insulator layer 16a, the second insulator layer 16b may be formed of any insulator material used in a wiring structure such as a silicon dioxide or a low-k material. The first and second insulator layers 16a and 16b are not required to be formed of the same material.

The mask pattern 20 is formed by applying a photoresist on the anti-reflection coating layer 18 and exposing and developing it. A location and a width of a via hole is determined by a window W of the pattern 20.

Figure 1B:
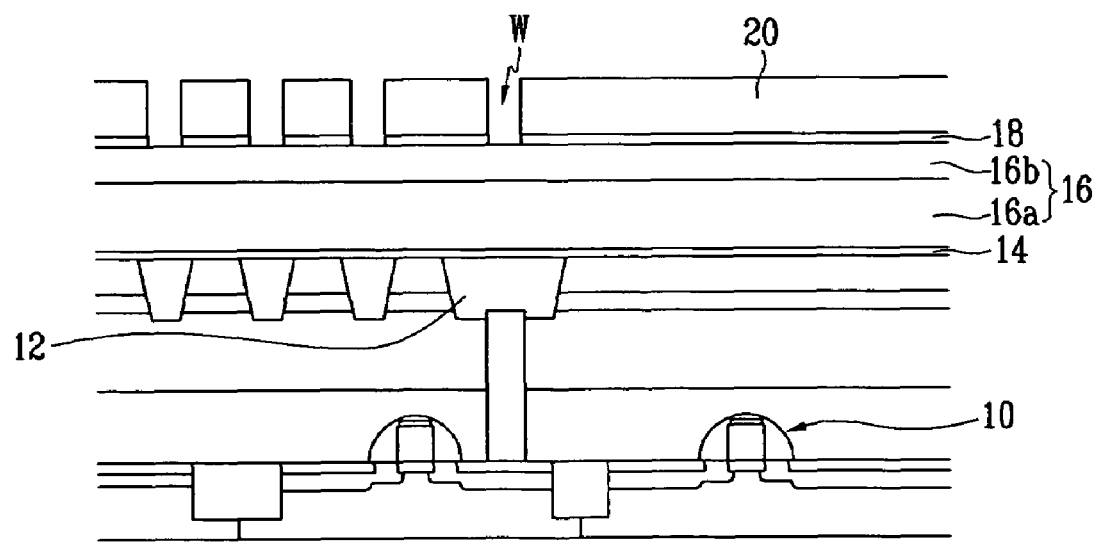

After the mask pattern 20 is formed, the anti-reflection coating layer 18 is selectively etched by a dry etching process, (for example, by reactive ion etching). FIG. 1B shows a state in which this etching has been completed.

Figure 1C:
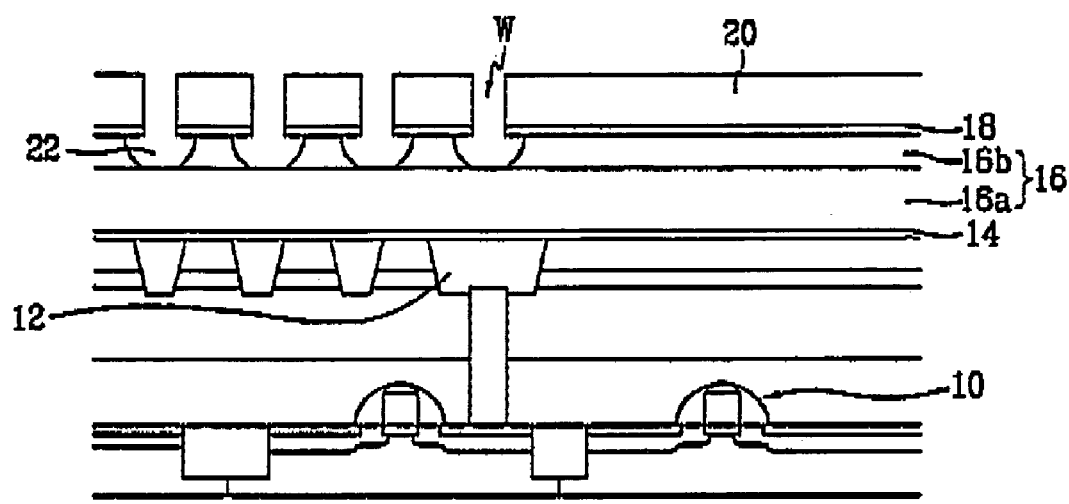
Figure 1D:
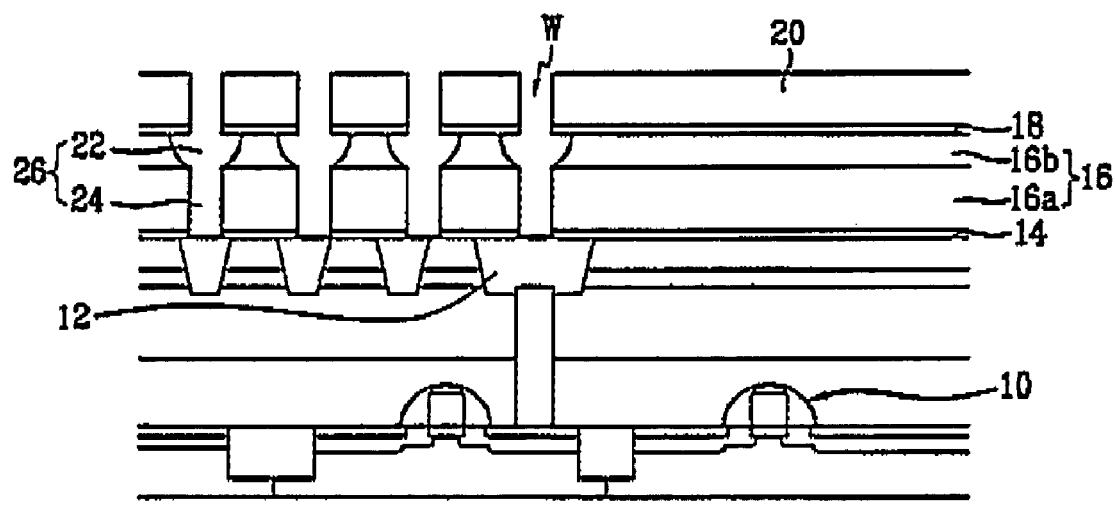

When the dry etching process is completed, as shown in FIG. 1B, the second insulator layer 16b is partially exposed. Subsequently, a trench 22 is formed by a wet etching process using a fluorine-containing solution, (for example, buffered hydrogen fluoride (BHF), or other chemicals). As shown in FIG. 1C, the trench 22 of the illustrated example is formed in a shape of a bowl due to a characteristic of the wet etching process. In the illustrated example, the anti-reflection coating layer 18 under the mask pattern 20 is not removed.

When the trench 22 is formed, the first insulator layer 16a remaining under the trench 22 is removed by a dry etching process using the mask pattern 20. Accordingly, a via hole 24 is formed. Therefore, a damascene pattern 26 including a via hole 24 and a trench 22 is formed.

Figure 1E:
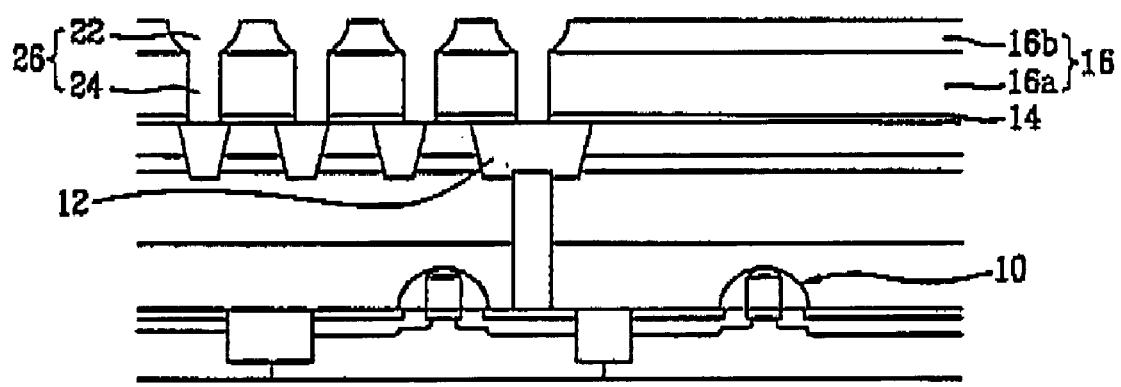

Subsequently, the mask pattern 20 is removed by an ashing process. FIG. 1E shows a semiconductor device with such a mask pattern 20 removed.

Although not shown in the drawings, after a barrier metal layer is subsequently formed in the damascene pattern, the damascene pattern is filled with a conductive material (for example, aluminum, an aluminum alloy, copper, a copper alloy, or various other metals). The barrier metal layer is planarized then to form a metal line.

In the illustrated example, the conductive material may be filled in the damascene pattern by, for example, chemical vapor deposition (CVD), physical vapor deposition (PVD), a combination of CVD and PVD, electroplating, and/or electroless plating.

As demonstrated above, a trench and a via hole can be formed using a single mask. Therefore, at least one stage for deposition and removal of a mask pattern may be skipped. Therefore, for the process of forming a sacrificial layer may be eliminated.

This simplifies the process for forming a metal line, so the yield may be improved.

From the foregoing, persons of ordinary skill in the art will appreciate that methods of fabricating metal wiring have been disclosed which reduce manufacturing costs and improve yield due to a reduction in a number of processes involved since a via hole and a trench may be formed using a single mask pattern.

In an example method described herein, after forming a trench in an intermetal insulation layer to a predetermined depth by performing wet etching using a mask pattern, a via hole is formed by removing the remaining intermetal insulation layer by dry etching using the mask pattern.

An example method of fabricating metal wiring in a semiconductor device includes: sequentially forming an etch stop layer, an intermetal insulation layer, an anti-reflection coating layer, and a mask pattern on a semiconductor substrate formed with a lower structure; etching the anti-reflection coating layer using the mask pattern; forming a trench by removing the intermetal insulation layer to a predetermined thickness by performing wet etching using the mask pattern; forming a via hole by removing the remaining intermetal insulation layer and the etch stop layer by dry etching them using the mask pattern; and removing the mask pattern.

A fluorine-containing solution may be used as an etchant in the wet etching. BHF may be used as the fluorine-containing solution. Reactive ion etching may be used in the dry etching.

It is noted that this patent claims priority from Korean Patent Application Serial Number 10-2004-0088692, which was filed on Nov. 3, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating metal wiring in a semiconductor device, comprising:
   sequentially forming an etch stop layer, an insulation layer, an anti-reflection coating layer, and a mask pattern on a semiconductor substrate;
   dry etching the anti-reflection coating layer using the mask pattern;
   wet etching the insulation layer to a depth less than a thickness of the insulation layer using the mask pattern to form a trench;
   forming a via hole by removing a remaining portion of the insulation layer below the trench by dry etching using the mask pattern;
   removing the mask pattern, and
   filling the trench and via hole with a conductive material.

2. A method as defined in claim 1, wherein the wet etching is performed with an etchant comprising a fluorine-containing solution.

3. A method as defined in claim 2, wherein the fluorine-containing solution comprises buffered hydrogen fluoride (BHF).

4. The method of claim 1, wherein the trench is formed in a shape of a bowl.

5. The method of claim 1, wherein said insulation layer comprises an oxide.

6. The method of claim 5, wherein said insulation layer comprises a first insulator layer and a second insulator layer different from the first insulator layer.

7. The method of claim 6, wherein said insulation layer comprises a first insulator layer selected from the group consisting of silicon dioxide, a low dielectric constant (low-k) material, a polyarylether, and Flowfill.

8. The method of claim 7, wherein said insulation layer comprises the low-k material and is selected from the group consisting of a fluorinated polyimide, a fluorinated silicate glass, an amorphous-fluorinated carbon, and low-k material derivatives of parylene-$AF_4$ and black diamond.

9. The method of claim 6, wherein said second insulator layer comprises a silicon dioxide or a low-k material.

10. The method of claim 9, wherein said insulation layer comprises the low-k material and is selected from the group consisting of a fluorinated polyimide, a fluorinated silicate glass, an amorphous-fluorinated carbon, and low-k material derivatives of parylene-$AF_4$ and black diamond.

11. The method of claim 5, wherein said etch stop layer comprises silicon nitride.

12. The method of claim 1, wherein said etch stop layer comprises silicon nitride.

13. The method of claim 1, wherein forming said mask pattern comprises applying a photoresist on the anti-reflection coating layer and exposing and developing the photoresist.

14. The method of claim 1, wherein selectively etching the anti-reflection coating layer comprises a dry etching process.

15. The method of claim 1, wherein the dry etching process comprises reactive ion etching.

16. The method of claim 1, wherein removing the mask pattern comprises an ashing process.

17. The method of claim 1, further comprising forming a barrier metal layer after forming the via hole and before filling said trench and via hole with the conductive material.

18. The method of claim 1, wherein filling said wench and via hole with a conductive material comprises chemical vapor deposition (CVD), physical vapor deposition (PVD), a combination of CVD and PVD, electroplating, electroless plating, or a combination thereof.

* * * * *